United States Patent [19]
Boulanger et al.

[11] Patent Number: 5,216,698
[45] Date of Patent: Jun. 1, 1993

[54] AUTOMATIC DEVICE FOR THE PHASE-LOCKING OF A CIRCUIT

[75] Inventors: Alain Boulanger, Brest; Pierre Guern, Plougonvelin, both of France

[73] Assignee: Thomson-CSF, Puteaux, France

[21] Appl. No.: 860,157

[22] Filed: Mar. 30, 1992

[30] Foreign Application Priority Data

Apr. 5, 1991 [FR] France .................. 91 04163

[51] Int. Cl.⁵ .................................. H03D 3/24
[52] U.S. Cl. .................. 375/120; 331/1 R; 328/155
[58] Field of Search .......... 375/82, 119, 120; 331/1 R, 2, 10, 25, 14; 328/14, 155

[56] References Cited

U.S. PATENT DOCUMENTS

| | | | |
|---|---|---|---|
| 4,298,986 | 11/1981 | Hughes | 375/119 |
| 4,691,176 | 9/1987 | Hsiung et al. | 331/2 |
| 4,733,404 | 3/1988 | Ostoich | 375/19 |
| 4,815,102 | 3/1989 | Roza | 375/120 |
| 5,018,170 | 5/1991 | Wilson | 375/120 |

*Primary Examiner*—Stephen Chin
*Attorney, Agent, or Firm*—Oblon, Spivak, McClelland, Maier & Neustadt

[57] ABSTRACT

A phase-locking device comprises a "fast" loop providing for the correction of the transient disturbances and a "slow" loop providing for correction on a wide range of phase shifts.

7 Claims, 5 Drawing Sheets

AUTOMATIC DEVICE FOR THE PHASE-LOCKING OF A CIRCUIT

BACKGROUND OF THE INVENTION

The present invention relates to a automatic device for the phase-locking of a circuit.

A known phase locking device, described in the French patent No. 88 15411, is used especially for a class C amplification system. This device has one or more servo loops. The adjustment of the propagation times between a direct channel and a return channel is done therein by hand. This device works very well, but the pre-positioning of the servo loops therein has to be done by hand: this does not permit total interchangeability of the circuit that is to be locked in phase.

SUMMARY OF THE INVENTION

An object of the present invention is a device for the phase-locking of a circuit, namely a device that enables an automatic pre-positioning, is capable of convergence in practically all circumstances, and provides for phase-locking even in the event of very slow and monotonic variations of phase disturbances, over a very wide range of frequencies, with a very short locking time for the correction of the disturbances.

The device according to the invention comprises a so-called "slow" loop, comprising the following in a cascade connection: a delay line, an amplifier, a phase-shifter, a 0/180° inverter, a filter and a device to detect the crossing of thresholds and for the control of the inverter.

BRIEF DESCRIPTION OF THE DRAWINGS

The present invention shall be understood more clearly from the following detailed description of several embodiments, given as non-restrictive examples and illustrated by the appended drawing, of which.

MORE DETAILED DESCRIPTION

Figure 1:
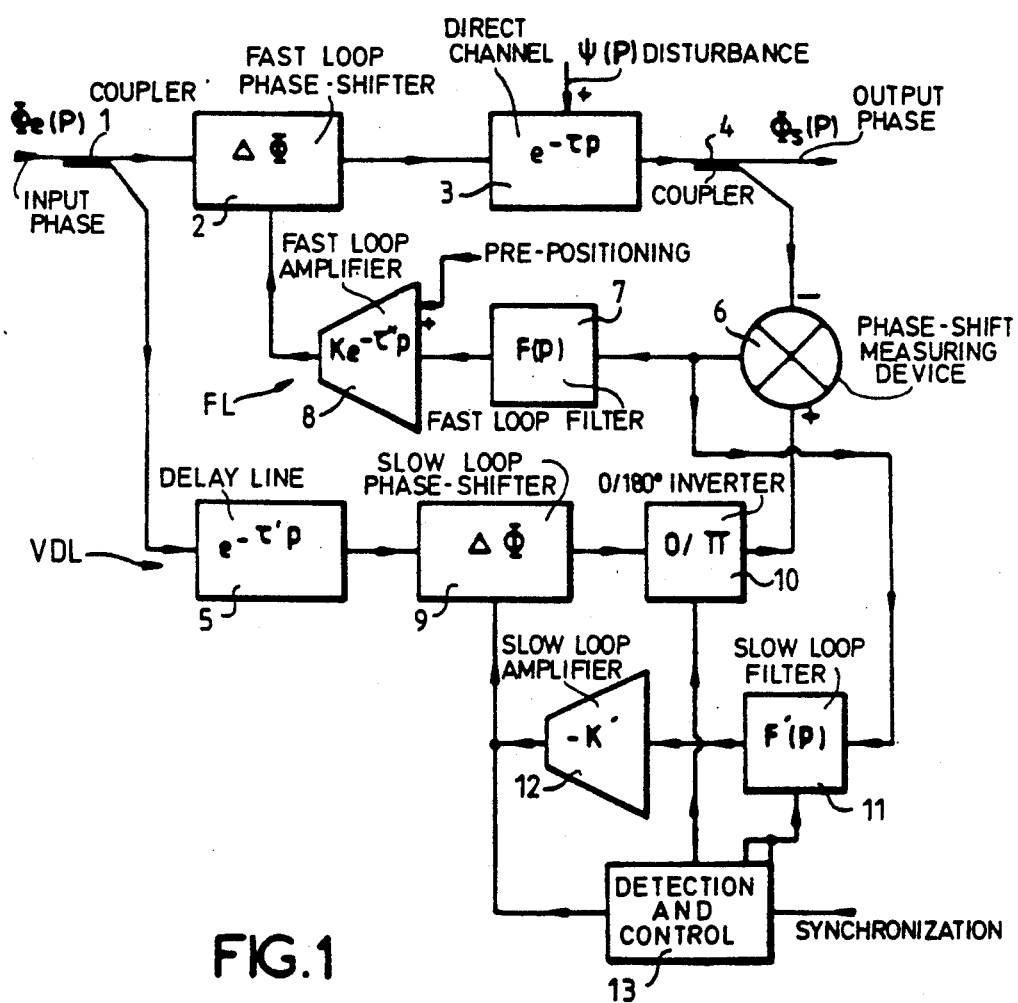
FIG. 1 is a block diagram showing the principle of a phase-locking device according to the invention.

The phase-locking system of the invention is preferably constituted by two servo loops, one fast loop and one slow loop. The fast loop corrects the transient type fast disturbances and phase noises, the variations of which are taken into account in the case of a Doppler processing operation and are therefore undesirable. It should also be very fast in order to preserve a correction band that is as wide as possible. Moreover, it should also be stable enough in terms of damping so that it does not generate unwanted pulses. Following the same line of thinking, it should display little noise so as not to contribute any more noise than it corrects. The function of the slow loop is to enable the fast loop to work as efficiently as possible. The slow loop should equalize the delays between the direct channel and the reference so as to provide for the convergence of the fast loop. It should also equalize the phase so as to bring the mean of the phase difference to the middle of the control characteristic curve of the fast loop in order to give this curve the maximum range of correction and efficiency.

The slow loop thus provides for the most efficient conditions of operation of the fast loop for the widest possible range of values of disturbance and delay of propagation of the direct channel.

At the same time, it guarantees the interchangeability of the elements of the direct channel. However, the working of the slow loop should not be perceived by the Doppler processing operation, and hence its time constant should be far greater than the greatest recurrence analyzed by the processing operation.

The phase-locking system is constituted, first of all, by a fast loop FL comprising a fast loop phase-shifter 2, a direct channel 3, a coupler 4, a phase-shift measuring device 6, a fast loop filter 7 and a fast loop amplifier 8.

The input phase $\Phi_e(p)$ is corrected by $\Delta\Phi$ by means of the fast loop phase-shifter 2, in the direct channel. The direct channel 3 is modelled in terms of phase characteristics by a propagation delay $\tau$ and a disturbance $\psi(p)$. The output phase of the direct channel 3 is measured by means of a coupler 4. The difference between the value measured at output of the direct channel 3 and the desired value is measured by means of a phase-shift measuring device 6. The error signal is then filtered by means of a transfer function $F(p)$ fast loop filter 7. This signal is then amplified by the fast loop amplifier 8. The assembly formed by the phase-shift measuring device the fast loop filter 7 and the fast loop amplifier 8 is modelled by a transfer function $F(p)$, a gain K and a propagation delay $\tau''$. It is possible, if necessary, to inject a pre-positioning signal in order to improve the performance characteristics of the fast loop. The correction signal of the fast loop is finally reinjected into the direct channel by means of the fast loop phase-shifter 8.

The desired value of the fast loop is generated at the assembly formed by the coupler 1, the delay line 5, the slow loop phase-shifter 9, the 0/180° inverter and the phase-shift measuring device 6.

The input phase $\Phi_e(p)$ is measured at the input of the direct channel so as to generate the desired-value signal. This signal is deferred in time by a delay $\tau$ by means of a delay line 5. It is then phase-shifted through the slow loop phase-shifter 9 and the 0/180° phase-shifter 10. The assembly VDL, comprising the delay line 5, the slow loop phase-shifter 9 and the 0/180° inverter 10, constitutes a variable delay line. Finally, the adjustment of the delay used to generate the desired value is controlled by the slow loop constituted by the assembly comprising the slow loop phase-shifter 9, the 0/180 inverter 10, the slow loop filter 11, the slow loop amplifier 12 and its detection and control device 13.

For this slow loop, the correction to be made is the equalization of the propagation time in the direct channel and the path of the desired-value signal in the fast loop. To this end, the output phase $\Phi_S(p)$ is used as a desired-value signal for the slow loop, and the signal at output of the 0/180° inverter is locked into this phase by means of the slow loop. The phase difference obtained at output of the phase-shift measuring device 6 is first of all filtered by means of the slow loop filter 11 and then amplified by the slow loop amplifier 12. The signal thus obtained is reinjected into the variable delay line assembly VDL by means of the slow loop phase-shifter 9. Since, with slightly downgraded performance characteristics, it is possible to phase-lock this loop to the desired value, with a possible difference of plus 2 kπ radians, the variable delay line comprises a fixed delay line 5 and a slow loop phase-shifter 9 with a finite dynamic range. The detection and control device 13 determines the state of the slow loop phase-shifter according to the value of the control signal of this phase-shifter coming from the slow loop amplifier 12. On the basis of this information, the detection and control device 13 generates two operations that are localized in time. If the phase-shifter reaches its limit of action, which corresponds to a phase compensation close to + or −π radians, the device 13 phase shifts the signal by + or −π radians by means of the 0/180° inverter 10. Simultaneously, it forces the value of the phase-shift introduced by the slow loop phase-shifter 9 to zero through its control signal sent to the slow loop filter 11. The slow loop therefore gets locked into the same phase as before the action of the detection and control device 13, but with a possible difference of plus 2 π radians, and in having brought the slow loop phase-shifter 9 to the middle of the characteristic curve.

The fact of locking into the ideal value, with a possible difference of plus 2 kπ radians (k being an integer), lowers the efficiency of the slow loop only if the frequency of the input signal, the phase of which is $\Phi_e(\rho)$, changes rapidly over a wide frequency band. The efficiency of the fast loop is not necessarily lowered, but its dynamic range of compensation is more limited because it has to compensate for both the disturbance $\psi(\rho)$ introduced by the direct channel 3 and the phase hops due to the combined effects of the frequency agility at input and the difference in propagation time between the direct channel 3 and the desired value of the fast loop which is locked into, with a possible difference of plus 2 kπ.

A detailed description shall now be given of the detection and control device 13 which provides for the convergence of the slow loop at the desired value with a possible difference of plus 2 πk, and thus enables the phase-locking device to obtain maximum efficiency of the correction made by the fast loop.

It will be noted that the slow loop can work independently, without the fast loop.

Figure 2:
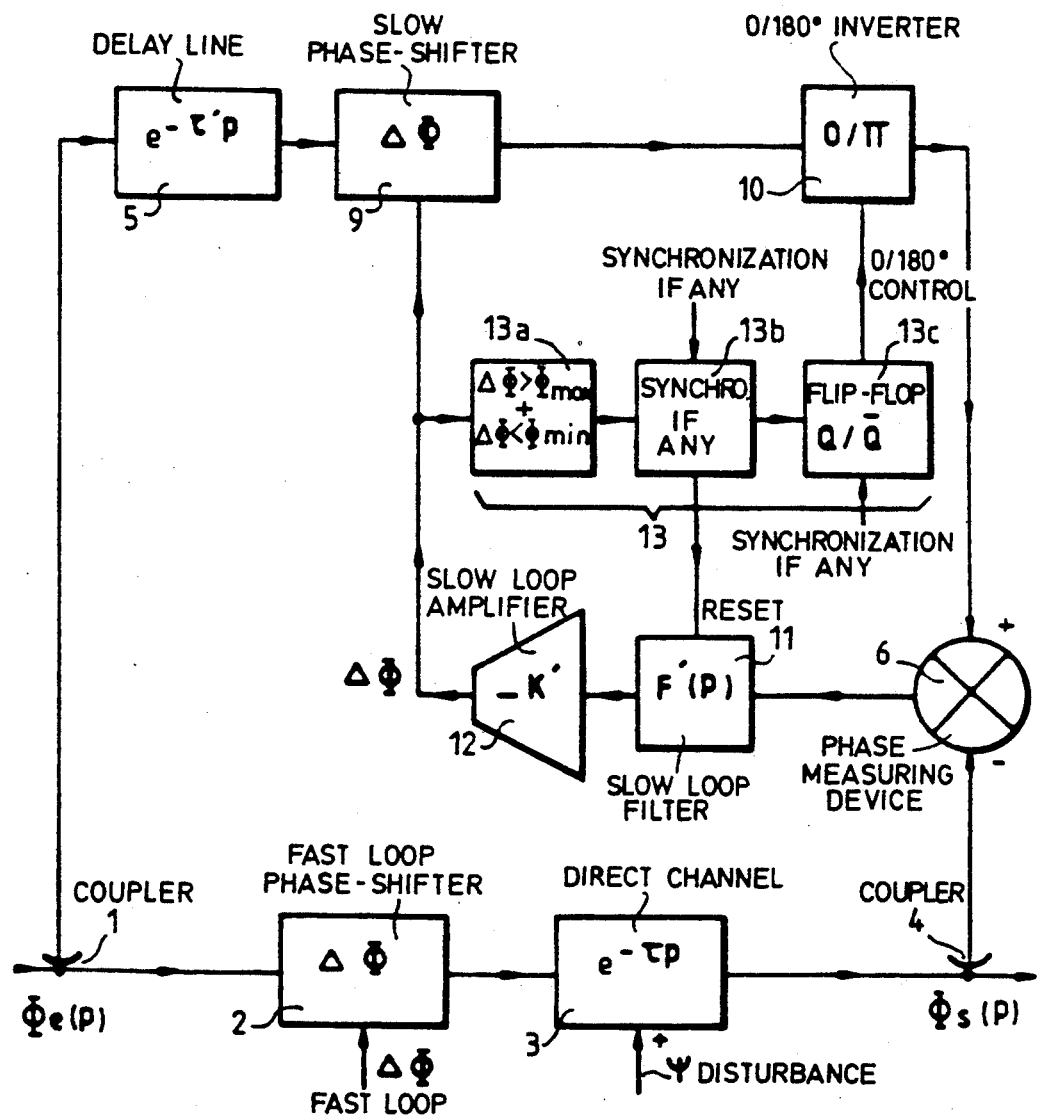
FIG. 2 is a block diagram of an embodiment of the device according to the invention.

FIG. 2 shows the details of the embodiment of the device 13 as well as the phase-locking device needed for the explanations.

The slow loop should be locked into the desired-value phase $\Phi_S(\rho)$ of the slow loop with a possible difference of plus 2 πk radians.

$$\Phi_S(\rho) = \Phi_e(\rho) + \Delta\Phi \text{ mean} + \psi \text{ mean}$$

The input phase $\Phi_e(\rho)$ is measured by means of the coupler 1. This input phase is deferred by a delay π' equivalent to the delay of propagation τ of the direct channel 3. The phase-shift measuring device 6 generates an error signal that is filtered and amplified by means of the slow loop filter 11 and the slow loop amplifier 12. The resulting signal is reinjected in the form of a phase shift ΔΦ into the slow loop phase-shifter 9. If this phase shift ΔΦ approaches the limits of action of the phase-shifter, the detection and control device 13 goes into action.

This action is implemented by three sub-assemblies 13a to 13c included in the device 13. The sub-assembly 13a, of the comparator type, ascertains whether the phase-shift ΔΦ exceeds the limit values Φmax, Φmin fixed for the dynamic range of the phase-shifter (minus a certain safety margin). The logic signal thus generated is synchronized, if necessary, with a signal external to the slow loop by means of the device 13b. The resultant signal is used for the resetting of the value integrated by the slow loop filter 11. Conjointly, a flip-flop type device 13c, which controls the 0/180° inverter, is triggered. The flip-flop device 13c can also receive a synchronization signal if necessary.

The result of the injection of the error signal into the phase-shifter 9 and of the action of the device 13 on the inverter 10 is that the slow loop gets locked into the desired value (with a possible difference of plus 2 π radians) before the action of the device 13, the phase-shifter 9 being positioned in the middle of the characteristic curve.

Figure 3:
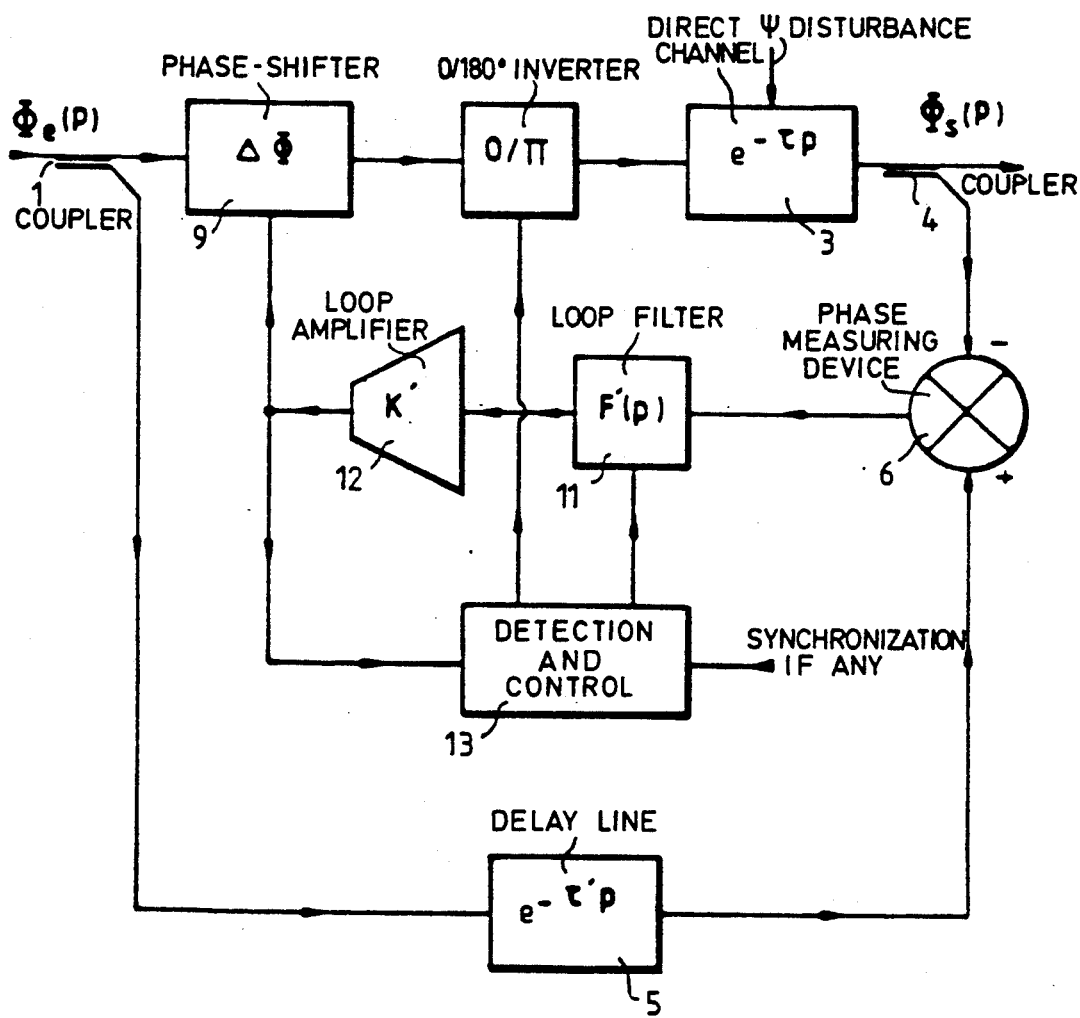
FIG. 3 is a block diagram of a variant of the device according to the invention.

According to the variant shown in FIG. 3, the slow loop may work independently (without a fast loop). The main channel comprises: the phase-shifter 9, the 0/180° inverter 10 and the direct channel 3 (which is liable to be subjected to disturbances ψ). A coupler 1 measures the input phase and is connected by a delay line (delay τ') to the phase-shift measuring device 6, which is furthermore connected to the output coupler 4. The error signal of the phase-shift measuring device 6 is sent, through the loop filter 11, to the slow loop amplifier 12, the output of which is connected to the phase-shifter 9 and to the detection and control device 13. This device 13 is connected to the filter 11 and to the inverter 10, and may, if necessary, receive a synchronization signal.

It will be noted that, in the case of the use of a fast loop and of a slow loop, in the fast loop the fast loop filter 7 may be either a specific component or result from the limitation characteristics of the passband of the components used by the other circuits of the loop. The fast loop phase-shifter may be either analog (with continuous phase shifts) or digital (with discrete phase shifts) or a combination of the two. The processing implemented by the fast loop filter and the fast loop amplifier 8 may be either analog or digital or a combination of the two, and this processing can be done in sample-and-hold mode. It may be possible, if necessary, to add a pre-positioning signal to it.

It will also be noted that, in the fast loop, the order of the elements 7 and 8 is arbitrary. The slow loop is constituted by: the coupler 1, the delay line 5, the phase-shifter 9, the 0/180° inverter, the filter 11, the amplifier 12 and the detection and control device 13. In this loop, the filter 11 may be either a specific component or may result from the limitation characteristics of the passband of the components used for the other circuits of the loop. The phase-shifter 9 may be either an analog phase-shifter with continuous variation of the phase shifts or a digital phase-shifter with discrete variation of the phase shifts, or a combination of the two. The 0/180° inverter may be either a phase-shifter or a logic inverter. The order of the elements 5, 9 and 10 is arbitrary.

The processing operation implemented by the filter 11 and the amplifier 12 may be analog or digital, or a combination of the two or, again, it may be done in sample-and-hold mode.

The order of the elements of the slow loop channel, namely the filter 11 and the amplifier 12, is arbitrary.

Thus, the device according to the invention is automatically locked into the phase of the input signal, with a possible difference of plus 2 πk radians, without there being a manual adjustment or a case by case adjustment. In this device, the circuit 13 provides for the convergence of the slow loop at the desired value with a possible difference of plus 2 πk radians. From the information on the state of the phase-shifter 9, this circuit 9 generates operations aimed at the convergence of the slow loop. The first operation consists in introducing an additional phase shift of + or −180° by the actuation of the inverter 10. The second operation consists in forcing the value integrated by the filter 11 to zero at specific instants. The resultant of these two operations is that the slow loop gets locked into the phase of the middle of the characteristic curve of the phase-shifter 9 with a possible difference of plus 2 πk radians. In other words, the device of the invention tends to automatically equalize the propagation times between the channel to be automatically controlled (comprising the element 3) and the desired value channel (slow loop).

The device of the invention may be implemented, for example, for the checking of the transfer function in phase of an amplification channel with solid state components or tube components (magnetrons, klystrons, etc.) for a servo-controlled phase-shifter, in a phase modulation/demodulation device, for the formation of assemblies with servo-controlled phase-shifters etc.

In one embodiment, implemented in a class C transmission channel, working in S band, showing the following characteristics: frequency agility of the order of 15%, propagation delay of the order of 40 ns, phase rotation during the transmitted pulse of the order of 100° (pulsed transmission mode), the following were obtained with the device of the invention: automatic convergence of the slow loop guaranteed at 100%, gain in correction on the phase transients of the order of 14 dB or the entire band, fast loop locking time (including propagation periods) of the order of 200 ns, fast loop rise time of the order of 80 ns, passband of the fast loop of about 5 MHz, and range of amplitude of correction of the fast loop for a locking time downgraded by a factor 4: about +170°.

Figure 4:
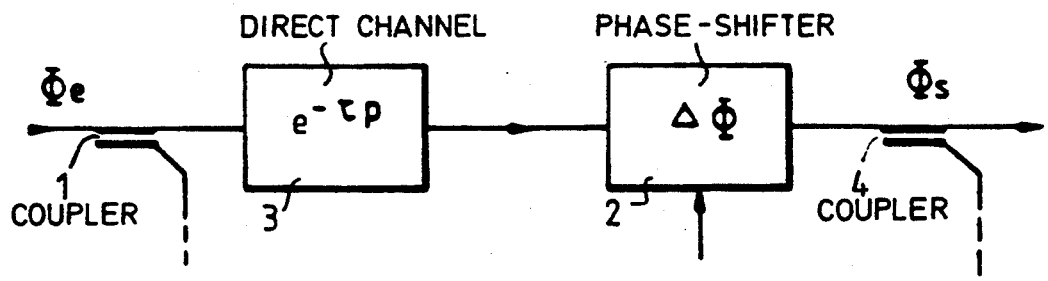
FIGS. 4 to 6 are equivalent diagrams of various parts of the device of the invention.

FIG. 4 shows the equivalent diagram of the direct channel. It comprises, between the input coupler 1 and the output coupler 4, the direct channel 3 having a delay τ and the phase-shifter 2, contributing a phase shift of ΔΦ. The order of the elements 2 and 3 is of no importance.

Figure 5:
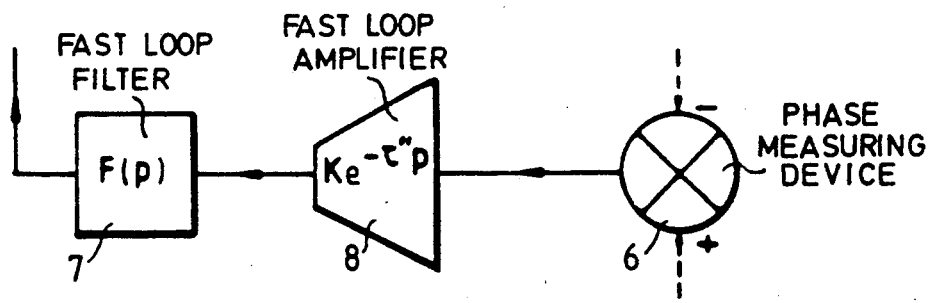

The equivalent diagram of the fast loop of FIG. 5 comprises: the phase-shift measuring device 6, the fast loop amplifier 8 (having a delay τ″ and gain K) and the fast loop filter 7 (with a filtering function F).

Figure 6:
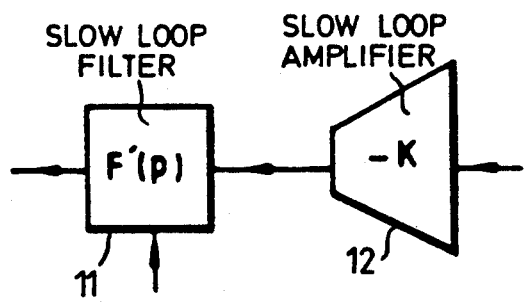

The equivalent diagram of the slow loop, shown in FIG. 6, comprises the slow loop amplifier 12 (with a gain K) and the filter 11 (with a filtering function F′).

Figure 7:
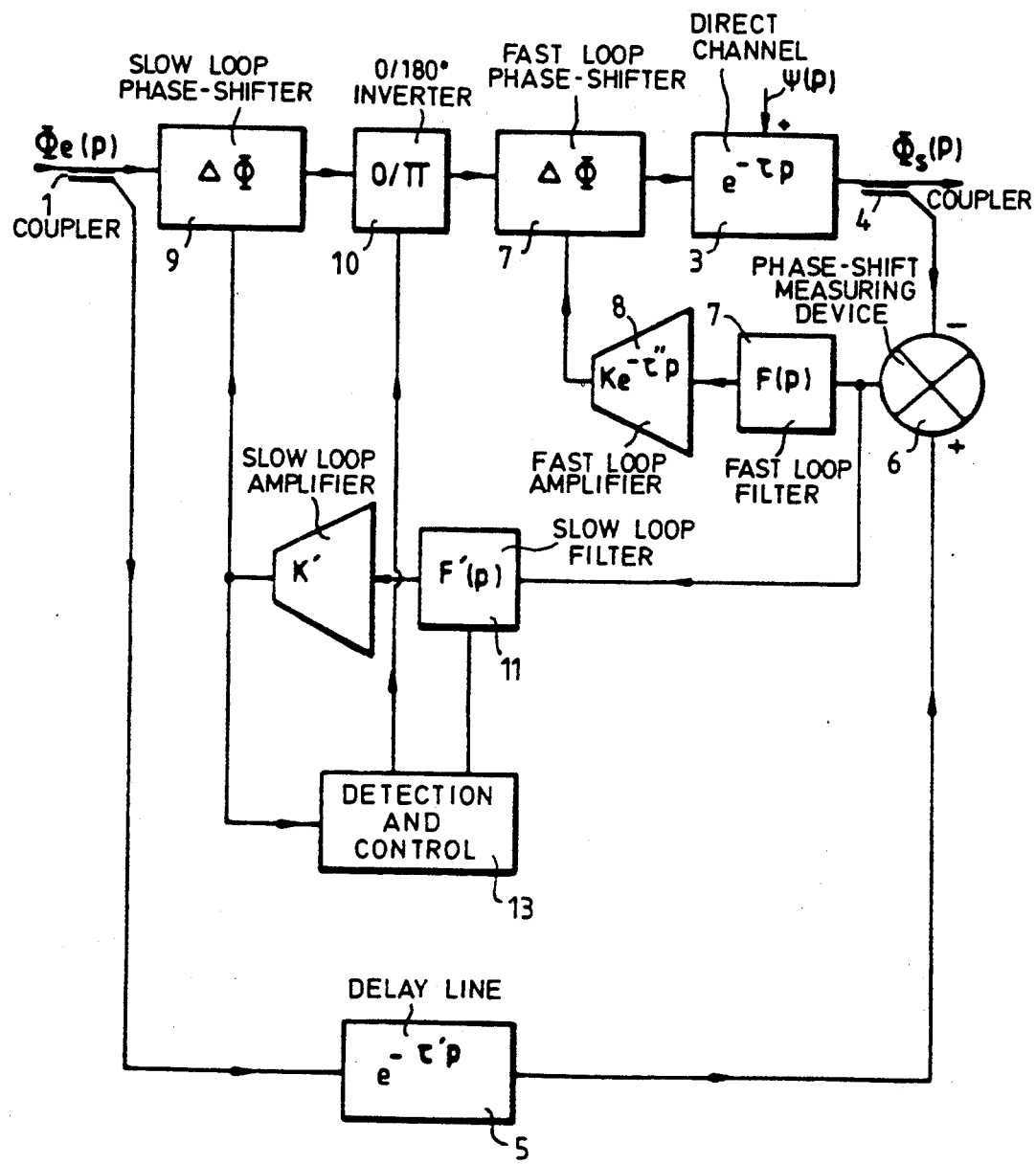
FIG. 7 is a block diagram of another embodiment of the device according to the invention.

FIG. 7 is block diagram showing the principle of an alternative embodiment of the device of the invention, according to which the slow loop acts on the overall correction factor, because a certain of its elements are inserted in the direct channel.

In the circuit of FIG. 7, the direct channel includes, between the input coupler 1 and the output coupler 4, the slow loop phase-shifter 7, the 0/180° inverter 10, the fast loop phase-shifter 7 and the direct channel 3. The phase-shift measuring device 6 and the delay line 5 are connected between the couplers 4 and 1. The output of the phase-shift measuring device 6 is connected, firstly, to a fast loop comprising the filter 7 and the amplifier 8 and, secondly, to the slow loop comprising the filter 11 and the amplifier 12 and to the inputs of the inverter 10 and of the filter 11.

What is claimed is:

1. An automatic device for the phase-locking of a circuit, said device comprising at least one servo loop in a bypass connection on the circuit to be phase-locked, wherein aid device comprises a "slow" loop, comprising sequentially connected in series, a delay line, a phase shifter, a 0/180° inverter, a filter, an amplifier, and means for controlling the 0/180° inverter to invert a phase provided by said 0/180° inverter at a time when a range of phase shift provided by said phase shifter is exceeded and for controlling phase shift provided by said phase shifter to be zero at said time, comprising a detection and control device.

2. A device according to claim 1, wherein the detection and control device includes a circuit to detect the crossing of phase thresholds, is connected to the output of the amplifier of the "slow" loop and connected to the input of a flip-flop circuit controlling the 0/180° inverter.

3. A device according to claim 2, wherein a circuit for synchronization with an external signal is connected between the detection circuit and the flip-flop circuit.

4. A device according to claim 1, wherein a phase-shift measuring device is positioned between the output of the circuit to be phase-locked and the delay line, and is connected to the input of the "slow" loop.

5. A device according to claim 1, wherein the filter results from the passband limitation characteristics of the components used by other circuits of the loop.

6. A device according to claim 1, further comprising:
a "fast" servo loop providing for the correction of the transient type fast disturbances and phase noises, said fast servo loop coupled to receive an input signal having a phase equal to a phase difference between a phase at an output at said bypass connection and a phase at an output of said 0/180° inverter.

7. A device according to claim 6, wherein said fast servo loop comprises sequentially in series, a fast loop filter, a fast loop amplifier, a fast loop phase shifter, and said input signal is coupled to an input of sad fast loop filter.

* * * * *